United States Patent [19]

Held

[11] Patent Number: 5,240,814
[45] Date of Patent: Aug. 31, 1993

[54] CURABLE, HEAT ACTIVATABLE TRANSFER TONERS

[75] Inventor: Robert P. Held, Englishtown, N.J.

[73] Assignee: E. I. Du Pont de Nemours and Company, Wilmington, Del.

[21] Appl. No.: 661,986

[22] Filed: Feb. 27, 1991

[51] Int. Cl.$^5$ ................................................ G03C 5/00
[52] U.S. Cl. ..................... 430/291; 430/120; 430/124; 430/126; 430/109; 430/54; 430/55; 430/292; 430/331; 430/201; 430/265; 430/324; 252/500; 252/511; 252/512; 252/514; 524/439
[58] Field of Search ............... 430/291, 120, 124, 126, 430/109, 54, 55, 292, 331, 265, 201, 324; 252/500, 512, 514, 511; 524/439

[56] References Cited

U.S. PATENT DOCUMENTS

| | | | |
|---|---|---|---|
| 3,506,469 | 4/1970 | Titow | 117/21 |
| 3,723,114 | 3/1973 | Hagenbach | 96/1.4 |
| 4,355,055 | 10/1982 | Beske et al. | 427/96 |
| 4,461,823 | 7/1984 | Held | 430/120 |
| 4,469,625 | 9/1984 | Held | 252/514 |
| 4,579,802 | 4/1986 | Kishi et al. | 430/99 |
| 4,939,069 | 7/1990 | Kawabata et al. | 430/291 |
| 5,039,588 | 8/1991 | Held et al. | 430/410 |

FOREIGN PATENT DOCUMENTS 3215550 11/1982 Fed. Rep. of Germany .

Primary Examiner—Jack P. Brammer

[57] ABSTRACT

A non-electroscopic prolonged tack toner for transferring toned images to an image receptor at low temperatures with improved back transfer characteristics.

16 Claims, No Drawings

CURABLE, HEAT ACTIVATABLE TRANSFER TONERS

FIELD OF THE INVENTION

This invention relates to prolonged tack toners and, in particular, to improved non-electroscopic prolonged tack toners for transferring toned images to image receptors at low temperature with reduced back transfer of the transferred image. This invention also concerns a method of using these toners to prevent back transfer.

BACKGROUND OF THE INVENTION

Prolonged tack materials prepared from thermoplastic resins and a plasticizer are well known in the art. Upon heating the thermoplastic resin and plasticizer mixture, the mixture becomes tacky or sticky and remains tacky for a considerable time even after cooling. This property is known as delayed tack or setting and has been found useful in the preparation of adhesive compositions, as well as in thermography, to produce a master which is imagewise exposed by means of heat, toned, and the toned image is then transferred onto an image receptor to provide a copy of the original image. In the above-described process, the prolonged tack property is present in the form of a continuous film over an imagewise tacky element.

The prolonged tack toners and transfer process described above can be used to make four color proofs. For example, in preparing a four color proof consisting of cyan, magenta, yellow, and black, the cyan toner image is transferred to a receptor. The magenta toner image is then transferred to the same receptor, with the two images in register. The yellow image is then transferred and finally, the black image is transferred so that all four images are in register. However, if the transferred toner image on the receptor remains tacky when the next color is transferred, the image on the receptor can back transfer to the surface of the photopolymer surface of the next color, resulting in partial image loss from the receptor to the photopolymer. Back transfer problems and the resulting image loss are unacceptable in the printing industry.

U.S. Pat. No. 4,461,823, issued to Held on Jul. 24, 1984, describes multiple transfer of tacky image areas using prolonged tack toners wherein the toners can be prepared by combining a thermoplastic resin, e.g., polystyrene, with a plasticizer or a copolymer of methylmethacrylate (90)/methacrylic acid (10) and triphenyl phosphate plasticizer. A dye or colored pigment can be combined with the resin/plasticizer component. One of the main disadvantages with these toners is that it is difficult to transfer a toned image to an image receptor without getting some back transfer when transferring the next color.

U.S Pat. No. 4,469,625, issued to Held on Sep. 4, 1984, describes prolonged tack toners for the preparation of electric circuits. Examples of organic polymers and plasticizers are described in column 1 and include polystyrene and N-cyclohexyl-p-toluenesulfonamide, poly(methylmethacrylate) (90)/methacrylic acid (10) and triphenyl phosphate. One of the main disadvantages using these toners is that it is difficult to transfer a sufficient amount of toner to an image receptor at a low temperature.

U.S. Pat. No. 3,405,469, issued to Titow on Apr. 14, 1970 describes a particulate ink system for use in a printing process comprising an ink transfer step and a print fixing step. The particulate ink comprises two components: an epoxy resin as the principle resin binder, and a curing agent for the epoxy resin that is dispersed in a low melting point polyamide. During the ink transfer step, the particulate ink is applied to a substrate. During the print fixing step, the two components are fused by heating to a temperature sufficient to melt the polyamide thereby bringing the curing agent into contact with the epoxy resin. Upon contact, the epoxy resin is cured and the image is fixed to the substrate.

U.S. Pat. No. 3,723,114 issued to Hagenbach on Mar. 27, 1973, describes an electrostatographic developing powder comprising a finely-divided colored resin consisting substantially of a solid, freeflowing and uncrosslinked thermosetting resin which is either a polymer of diallyl phthalate, a polymer of diallyl isophthalate or a mixture of such polymers. The thermal cure crosslinks the allyl groups. These electrostatographic toners provide final copies having improved storage properties.

U.S. Pat. No. 4,579,802 issued to Kishi et al..on Apr. 1, 1986, describes a method of fixing a toner image on a supporting member by bringing the supporting member supporting thereon the toner image into pressure contact with a fixing roller, wherein an elasticity improving agent is used to increase the elasticity of the toner. These elasticity improving agents include agents capable of enhancing the elasticity of toner material, polyhydric alcohols, polyvalent amines, and polyvalent carboxylic acids.

Applicant's assignee's copending application, Ser. No. 07/422,361 filed Oct. 16, 1989 and allowed Feb. 15, 1991, describes a non-electroscopic prolonged tack toner comprising an organic, thermoplastic terpolymer, a solid plasticizer and optionally a colorant wherein said toner is suitable for transferring toned images at low temperatures to an image receptor.

SUMMARY OF THE INVENTION

This invention relates to a non-electroscopic prolonged tack toner comprising:
(i) an organic thermoplastic polymer containing acid groups
(ii) a solid plasticizer present in an amount of about 30 to 90% by weight;
(iii) a crosslinking compound selected from the group consisting of:
(a) a β-diketone compound of the general formula:

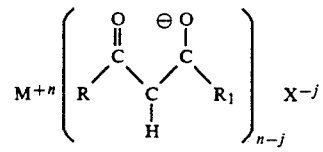

where
M is a metal cation;
R and $R_1$ which can be the same or different are alkyl of 1 to 18 carbon atoms, substituted alkyl of 1 to 18 carbon atoms, aryl of 6 to 30 carbon atoms, or substituted aryl of 6 to 30 carbon atoms;
+n is the valency of the metal;
J is 0 to +n−1; and
$x^-$ is selected from the group consisting of OH, Cl, F, sulfate, nitrate, chlorate, phosphate, acetate, alkyl carboxylate of 1 to 18 carbon atoms, or aryl carboxylate of 6 to 30 carbon atoms; and (b) at least one organometallic compound selected from the group consisting of $M^{+n}(R-)_n$, $M^{+n}(CO_2R'-)_n$ and $M^{+n}(OR''-)_n$ wherein R, R', and R'', are independently selected from the group consisting of a linear hydrocarbon of 1 to 30 carbon atoms, or a linear or branched chain, substituted hydrocarbon of 10 to 30 carbon atoms, M is a metal, and n is at least 2 and is equal to the valency of the metal.

In accordance with another embodiment of the invention there is provided a process for forming an image from an element having a latent image, said image having toner receptive and background areas, said process comprises:

(a) applying to the latent image of the element a prolonged tack toner of the type described above to produce a non-tacky toned image;

(b) heating the toned image to a temperature sufficient to activate the toner by rendering the toner tacky;

(c) bringing the tacky toned element into intimate contact with an image receptor, and, while the toner is still activated;

(d) separating the element from the image receptor whereby a portion of the activated prolonged tack toner transfers imagewise to the receptor; and (e) heating said transferred toned image on the receptor to a temperature of 90° to 400° C. which is above the toner activating temperature to crosslink the prolonged tack toner.

DESCRIPTION OF THE INVENTION

The term "prolonged tack toner" means a toner that is non-tacky at normal room temperatures but upon heating to an elevated temperature becomes and remains tacky for a period of time even though the temperature of the toner returns or is returned to a temperature below the temperature at which the toner became tacky, including room temperature. Such toners are sometimes referred to as delayed tack toners.

The term "non-electroscopic" means that the toners are neither repelled from nor attracted to a charged rod when placed in close proximity to the particles.

A latent tacky image has tacky toner-receptive areas and non-tacky background areas. The image is formed from films comprising a support with a photosensitive layer. The films are capable of forming imagewise tacky and non-tacky images on their surface, either directly, e.g., by exposure to actinic radiation, or by treatment with solutions, heat, or other means. Preferably the tacky images are formed in photosensitive layers which comprise positive-working or negative-working compositions. Suitable positive-working compositions are photohardenable, e.g., photopolymerizable compositions disclosed, for example, in Chu and Cohen, U.S. Pat. No. 3,649,268 and suitable negative-working compositions are disclosed for example, in Abele and Grossa, U.S. Pat. No. 4,243,741; Cohen and Fan, U.S. Pat. No. 4,174,216, Dueber, U.S. Pat. No. 4,162,162, and Kempf, U.S. Pat. No. 4,859,551.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

One of the problems with conventional toners is that it is very difficult to transfer toned images to an image receptor without back transfer problems because the transferred image on the receptor remains tacky. Consequently, image formation using multiple transfers, e.g., in making a four color proof, effected at low temperatures using conventional toners has been inferior. It has been found that such back transfer problems can be improved by blending a crosslinking compound into a non-electroscopic prolonged tack toner comprising an organic, thermoplastic terpolymer, a solid plasticizer, and pigment and applying the toner to a latent image and subsequently using conductive heat to cure the image.

The term "heat curing" means the application of heat to a transferred toned image to promote sufficient crosslinking of the metal salts of the crosslinking compound with the polymer acid groups in the terpolymer/plasticizer mixture.

The toners of this invention can be made readily as described in Example 1 below. These toners facilitate high quality transfers of toned images to image receptors at low temperatures and exhibit improved back transfer characteristics. Multi-copy transfer can occur at low temperature thereby simplifying the process and eliminating heat distortions. Thus, greater resolution is obtained. The non-electroscopic, prolonged tack toners of the invention comprise an organic, thermoplastic terpolymer, a solid plasticizer and a crosslinking compound selected from the group consisting of a β-diketone and an organometallic compound. Optionally, a colorant may be added to the terpolymer/plasticizer mixture.

The organic thermoplastic terpolymer consists of substantially equal percentages by weight of styrene, alpha-methyl styrene and an acid selected from the group consisting of acrylic acid and methacrylic acid which can be made using conventional techniques such as solution polymerization. The preferred acid is acrylic acid. The terpolymer has an average molecular weight in the range from 1,000 to 100,000, preferably 1,500 to 10,000 and, most preferably, 2,000 to 8,000. It is present in an amount from 10% by weight to 70% by weight based on total weight of polymer and plasticizer and, more preferably, 20% to 50%. Other acrylate based polymers such as copolymers of methyl methacrylate/acrylic acid (90/10) molecular weight 20,000, can be used as well.

A solid plasticizer is added to the organic thermoplastic terpolymer. Plasticizers suitable for practicing the invention include triphenyl phosphate, diphenyl phthalate, dicyclohexyl phthalate, or N-cyclohexyl-p-toluenesulfonamide. However, the preferred plasticizer is triphenyl phosphate. The plasticizer is present in an amount from about 30% to about 90% by weight based on total weight. However, the preferred range is from about 50% to about 70%.

Optionally, a colorant, such as a dye or pigment, can be added to the terpolymer/plasticizer mixture. A number of dyes and pigments known to those skilled in the art can be used. Colorants suitable for practicing the invention include a dye or pigment such as carbon black which can be combined with the terpolymer and plasticizer. The colorant is present in an amount from 0% to 50% based on total toner weight and, more preferably, from 0.5% to 20%.

The crosslinking compound can be a β-diketone compound or an organometallic compound.

β-diketone compounds which can be used have the general formula:

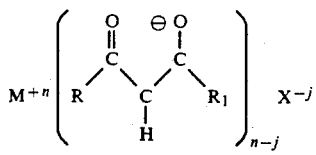

where M is a metal cation such as $Al^{+3}$, $Ca^{+2}$, $Ni^{+2}$, $Cr^{+3}$, $Mg^{+2}$, etc.; R and $R_1$ which can be the same or different are alkyl of 1 to 18 carbon atoms, substituted alkyl of 1 to 18 carbon atoms which is substituted with alkyl of 1 to 10 carbon atoms, alkoxy of 1 to 10 carbon atoms, halogen such as chloride, bromide, etc.; amino, and other substituents known to those of ordinary skill in the art, aryl of 6 to 30 carbon atoms, substituted aryl of 6 to 30 carbon atoms substituted with alkyl of 1 to 10 carbon atoms, alkoxy of 1 to 10 carbon atoms, halogen such as chloride, bromide, etc.; amino, hydroxyl, nitro, and others known to those of ordinary skill in the art; n is the valency of the metal; J is O to n−1; and X− is OH, Cl, F, sulfate, nitrate, chlorate, phosphate, acetate, alkyl carboxylate of 1 to 18 carbon atoms, aryl carboxylate of 6 to 30 carbon atoms.

Suitable metal salts of β-diketone include: zinc acetylacetonate, titanium acetylacetonate, calcium acetylacetonate, aluminum acetylacetonate, aluminum octadecanoylacetonate, aluminum benzoylacetonate, calcium octadecanoylacetonate, calcium benzoylacetonate, nickel acetylacetonate, chromium acetylacetonate, aluminum diacetylacetonate hydroxide, calcium acetylacetonate hydroxide, aluminum diacetylacetonate chloride, aluminum octanoylacetonate, calcium octanoylacetonate, aluminum dodecanoylacetonate, calcium dodecanoylacetonate, nickel benzoylacetonate, chromium benzoylacetonate, aluminum p-methoxybenzoylace-tonate, aluminum trifluoroacetylacetonate, aluminum hexafluoroacetylacetonate, magnesium acetylacetonate, etc.

It is believed that a bivalent salt helps to prevent back transfer by crosslinking with the polymer acid functional groups in the toner. After applying toner to the image and after transfer to a receptor, heat is applied to the transferred image in order to accelerate the crosslinking reaction.

Organometallic compounds which can be used to practice the invention include at least one compound of the formula:

$M^{+n}(R-)_n$, $M^{+n}(CO_2R'-)_n$ or $M^{+n}(OR''-)_n$ where R, R' and R'', one independently selected from the group consisting of a linear or branched hydrocarbon of 1 to 30 carbon atoms, or a linear or branched chain hydrocarbon of 1 to 30 carbon atoms substituted with at least one substituent selected from the group consisting of halogen, e.g., Cl, Br, I, F; one or more hydroxyl groups, nitro cyclopentyl, cyclohexyl, aryl, e.g., phenyl, naphthyl, etc.; M is Bi, Ca, Ce, Co, Fe, Mg, Mn, Mo, Ni, Pb, Ti, V, Zn, Zr, etc.; n is at least 2 and is equal to the valence of the metal (M). One or more of the organometallic carboxylate or alkoxide type compounds can be present in toner.

Examples of organometallic compounds, wherein the substituents (ligands) attached to $M^{+n}$ in the formula $M^{+n}(CO_2R'-)_n$ are selected from the group consisting of propionate, butyrate, hexoate, octaoate, nonoate, 2-ethylhexoate, neodecanoate, naphthenate, ethoxide, butyl, isopropyl, etc., include: zinc naphthenate, zinc 2-ethylhexoate, zinc octoate, zirconium octoate, zirconium 2-ethylhexoate, manganese octoate, manganese naphthenate, manganese 2-ethylhexoate, barium 2-ethylhexoate, cobalt naphthenate, calcium octoate, calcium naphthenate, calcium 2-ethylhexoate, calcium nonoate, nickel octoate, bismuth octoate, bismuth neodecanoate, bismuth 2-ethylhexoate, lead octoate, cobalt octoate, lead naphthenate, cerium naphthenate, cerium 2-ethylhexoate, tetrabutyl titanate, tetra-2-ethylhexyl titanate, titanium tetraethoxide, tetraisopropyl titanate; calcium, cerium, cobalt, lead, manganese, zinc and zirconium salts of neodecanoic acid made by Mooney, Inc., Cleveland, Ohio, and mixtures of the compounds.

The crosslinking compound is present in an amount of about 2 to 30 percent by weight of metal salt based on the total weight of toner.

The toner particles have a size distribution within the range of 0.2 to 30 micrometers and not more than 50% of the toner particles are less than 1 micrometer particle size as described in U.S. Pat. No. 3,620,726.

The toners of the present invention are used to tone photopolymerizable or photohardenable elements comprising photopolymerizable or photohardenable compositions on supports. There can be mentioned as photopolymerizable or photohardenable compositions are: (1) those in which a photopolymerizable monomer is present alone or in combination with a compatible binder, or (2) those in which the photopolymerizable groups are attached to a polymer backbone which becomes activated to light and can then crosslink by reacting with a similar group or other reactive sites on adjacent polymer chains. Photopolymerizable systems of the latter type where the monomer or pendant photopolymerizable group is capable of addition polymerization, e.g., a vinyl monomer, the photopolymerized chain length can involve addition of many similar units initiated by a single photochemical event. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

If either a simple monomer or monomer-polymer binder composition is being used, the photosensitive layer preferably contains a free radical generating, addition polymerization initiator. Plasticizing agents, as well as other known additives, can be present in the photosensitive layer.

Free radical initiated, chain propagating, additional polymerizable layers which can be used to practice the invention are described in U.S. Pat. Nos. 3,060,023, 3,261,686 and 3,380,831 and are herein incorporated by reference. Polymers for use in the monomer-polymer binder system and preferred free radical generating addition polymerization initiators are described in U.S. Pat. No. 3,060,023 and are herein incorporated by reference.

Photodimerizable materials useful in practicing the invention include cinnamic acid esters of high molecular weight polyols, polymers having chalcone and benzophenone type groups, and others disclosed in Chapter 4 of "Light-Sensitive Systems" by Jaromir Kosar, published by John Wiley & Sons, Inc., New York, 1965. Photopolymerizable materials capable of photocrosslinking with more than one adjacent polymeric chain to form a network are described in U.S. Pat. Nos. 3,418,295 and 3,469,982.

Preferred free radical generating addition polymerization initiators, activatable by actinic radiation, e.g., ultraviolet and visible radiation, are listed in U.S. Pat. No. 3,060,023 and the other patents referred to above.

Plasticizing agents which can be present in the photosensitive layer include dialkyl phthalate, polyoxyethylene(4)monolaurylether, polyethylene glycol, triethylene glycol diacetate, alkyl phosphates, etc.

A photosensitive layer, 0.0003 to 0.004 inch (0.0076 to 0.10 mm) thick, is present on a support such as a polymer film, plastic, metal or sheet such as paper whereon it adheres. The photosensitive composition can be either laminated or coated on the support under conditions known to those skilled in the art. A known protective film such as the one described in U.S. Pat. No. 3,060,026 can be present on the photosensitive layer. A protective film, such as polyethylene terephthalate, polyethylene, etc., can be present during imagewise exposure but is removed prior to application of the non-electroscopic, prolonged tack toner to the tacky imaged surface.

The photopolymerizable layer is exposed to actinic radiation, generally through a process negative or positive transparency. The transparency is an image-bearing transparency consisting solely of substantially opaque and substantially transparent areas where the opaque areas are substantially of the same optical density.

Photosensitive compositions used in the process of this invention generally exhibit their maximum sensitivity in the ultraviolet range, therefore, the radiation source should furnish an effective amount of this type of radiation having a wavelength range between 320–400 nm, and for blue sensitive photopolymers, the wavelength range is between 400–500 nm, usually with appropriate filters such as Kokomo ® and Lexan ® filters. For example, to filter out ultraviolet radiation in the range of 320–400 nm a Lexan ® filter is used and a Kokomo ® filter is used to filter out blue radiation in the 400–500 nm range. Suitable radiation sources include carbon arcs, mercury-vapor arcs, fluorescent lamps with special ultraviolet-emitting phosphors, argon glow lamps, electronic flash units and photographic flood lamps. The radiation exposure time can vary from fractions of a second to minutes, depending upon the intensity, type of radiation source used, its distance from the photopolymer element and nature and amount of photopolymer element. In general, exposure times range from 10 seconds to 10 minutes or more using standard commercial radiation sources.

Following imagewise exposure and removal of the cover sheet, the image is developed by toning the tacky image areas with particles of a non-electroscopic, prolonged tack toner of the type described above. The toner particles adhere primarily in the tacky image areas. Any toner particles remaining in the non-tacky background areas can be removed by means known in the art, e.g., wiping, air devices, etc. The prolonged tack toner particles are activated by heating the toner particles to at least a temperature wherein the toner particles become tacky.

The activated tacky toned image-bearing substrate is then brought into intimate contact, under pressure, at a low temperature in the range from 20° C. to 70° C. with an image receptor. Image receptors suitable for practicing the invention include paper, uncoated or coated paper such as Kromekote ®, film such as polyethylene terephthalate, or metals such as aluminum copper clad fiberglass, epoxy, or phenolic resin board.

Following separation of the element from the image receptor, the toner fails cohesively and a portion thereof transfers imagewise to the image receptor. At this point, the transferred toned image is tacky and after reducing the temperature of the prolonged tack toner particles to below their activating temperature, the prolonged tack toner particles remain tacky for a period of time. The transferred toned image on the receptor is then heated to a temperature of about 90° to 400° C. which is above the toner activating temperature to deactivate the prolonged tack toner. The image is now non-tacky and thus able to receive an additional transferred image. The process can be repeated to receive each additional transferred image and thereby produce a multi-layered image with improved back transfer characteristics.

An image capable of accepting a prolonged tack toner of the type disclosed below, a method for applying toner thereon and a heating source to heat the transferred image are needed to practice the process of the invention.

The automatic toning apparatus described in U.S. Pat. No. 4,069,791 and the toning and transfer apparatus described in U.S. Pat. No. 4,461,823, the disclosures of which are hereby incorporated by reference, can be used to practice the invention.

Radiative and conductive heat may be used to cure the transferred image. Heat sources suitable for practicing the invention include a hot plate, a quartz heater, cal-rod heaters, etc.

Prolonged tack toned images of the types described above can be used in single or multiple transfers to an image receptor using the same or different toners. The transferred image can also be toned subsequently with additional prolonged tack toner to generate a higher density transferred image. Multicolored images can be prepared on at least one image receptor by preparing a desired number of photosensitive elements, e.g., at least two and, preferably, four, exposing each element through a different color separation transparency and toning each imagewise tacky element with the appropriately colored prolonged tack toner. Each toned image is then transferred in register to the same image receptor, then heated to effect crosslinking. Following heat treatment, the transferred image is detackified. Thus, using the toners of the instant invention, a four color proof can be made without any back transfer problems.

The invention is useful for the preparation of toned images of high optical density wherein a tackified toned image on an element is retoned with additional toner a number of times, so as to build the image density on the surface of the element to any desired point.

Furthermore, high optical densities can be obtained on different image receptors by reheating the toned image left behind on the element after the initial transfer, followed by partially transferring this reheated toned image to a different image receptor, reducing the temperature of transferred toned image below the activating temperature of the prolonged tack toner wherein the toner remains tacky and retoning the transferred toned image with additional dry particulate prolonged tack toner.

Resist images can be formed by transferring the toned image to copper clad laminates, e.g., phenolic resin or fiberglass epoxy boards, for example, and subsequently etching or plating the boards in the conventional manner.

Lithographic printing plates can also be prepared by transferring the toned image to a lithographic surface, e.g., an aluminum plate, at a temperature in the range from 20° C. to 70° C. The transferred image is then treated and inked to produce inked impressions of the image.

Heretofore, it has been quite difficult to transfer an image from an element to an image receptor using conventional toners. As is shown in the examples below, the toners described herein make it possible to transfer images to image receptors at low temperatures with reduced back transfer.

The following examples illustrate the practice of the invention.

EXAMPLES

In the following examples, all percentages are by weight unless otherwise specified.

All toners were evaluated according to the procedure described in Example 1 unless otherwise specified.

EXAMPLE 1

A cyan toner was prepared according to the following procedure:

26.4 grams (6.6%) of Heliogen® Blue K 7090 (BASF Corp., Holland, Mich. 49423), 244.4 grams (61.1%) of triphenyl phosphate (Monsanto Company, St. Louis, Mo. 63167) and 129.2 grams (32.3%) of a terpolymer consisting of approximately equal percentages by weight of styrene, alpha-methyl-styrene and acrylic acid and having a weight average molecular weight of ca. 2500 were placed in a 2 quart Bain Marie container (Le Beau Products, Baraboo, Wis. 53913). A 6 inch (15.24 cm) stainless steel chain was added and the mixture shaken on a Paint Conditioner, Model MKI-R (Red Devil, Inc., Union, N.J. 07083) for 30 minutes.

The mixture was slowly added to a 2 roll rubber mill at 50°-55° C. so that a continuous molten band formed. The mill had 6 inch (15.24 cm) diameter rolls, 13 inches (30.48 cms) wide (William Thropp & Sons, Salem, Ohio 44460). The mixture was cut by a doctor blade and returned repeatedly to the mill to reband for 20 minutes. The dispersion was then left on the rotating rolls for another 20 minutes. After removal from the rolls, it was cooled and broken up into 1-3 inch (2.54-7.62 cm) chips which were sufficiently small to be fed to a hammer mill.

The chips were then fed to a Reitz mill to produce a course powder. The powder was fed to an 8 inch (20.32 cm) jet mill (Jet Pulverizer Co., Palmyra, N.J.) at 50 grams per minute. Particle size was obtained on a Coulter Counter Model TAII (Coulter Electronics, Inc., Hialeah, Fla. 33010) with a 30 micron aperture. Population average was 1.6 microns. Volume average was 13.0 microns.

The 2 roll mill temperature was followed fairly closely. If the temperature rises much above 55° C. the melt will become too fluid and drip from the mill. If much below 50° C. the mass will not melt and dispersion will not take place.

Powdered zinc acetylacetonate was added to the toner by physically blending it in a jar with toner using a blender (Osterizer, Liquefier Blender) at a weight ratio of 10 grams of toner to 1.0 gram of zinc acetylacetonate.

A photopolymerizable element similar to that described in U.S. Pat. No. 4,461,823 was placed in a vacuum frame, with the cover sheet facing the glass cover of the vacuum frame. A transparency bearing a positive halftone image of the subject to be reproduced was then placed over the cover sheet, and the vacuum frame glass cover closed. A vacuum of about 25 inches of water (approx. 635 kg/m$^2$) was applied to assure intimate contact of the transparency and the element. Using a 5 KW mercury vapor light source at a distance of 58 inches (147.3 cms), the photopolymer element was given a 35 second exposure. As a result of the exposure to actinic radiation, the unexposed areas of the photopolymerizable layer surface were imagewise tacky and the exposed areas were non-tacky.

The element was then removed from the vacuum frame and the cover sheet was peeled off. The exposed element was then toned by hand using an acrylic pad material attached to a plastic handle, whereby the toner prepared as described above was applied over the exposed photopolymerizable surface. Toner particles adhered to the tacky areas and the remaining toner was wiped off the element by a special cloth (Las-Stik ® manufacture by Las-Stik Manufacturing Co., Hamilton, Ohio). The toned element was then subjected to heating to 135° F. (57.2° C.) for about 1 minute on a heating platen. The image was then transferred to a Kromekote ® receptor manufacture by the Champion Paper Co. at a transfer speed of 3.5 ft/min (0.5 cm/sec) in a modified Cromalin ® laminator manufactured by Du Pont equipped with a metal heated roll at 50° C. and an unheated roll. The transferred image on Kromekote ® was then heated by convection on a hot plate at 200° F. (94° C.) for about 3 minutes. Prior to heating this image was tacky to the touch, but after heating which resulted in crosslinking, the image was no longer tacky.

The transferred toner image had good quality with a resolution of 2-97% dots in a 150 lines per inch target. The density was uniform at about 1.30 as measured on a Macbeth reflection densitometer.

COMPARATIVE EXAMPLE

A cyan toner was prepared according to the procedures described in Example 1 except that zinc acetylacetonate was not added to the toner. The toner was used to make a transferred image as described in Example 1, however, the transferred image was not heated. The image on the paper remained tacky to back transfer.

EXAMPLE 2

A magenta toner was prepared according to the procedure of Example 1 with the following exceptions:

22.2 grams Quindo ® Magenta RV-6803 (Mobay Corp., Haledon, N.J. 07508), 4.2 grams Indofast Brilliant Scarlet R-6300 (Mobay Corp.), 200.0 grams triphenyl phosphate and 173.6 grams of terpolymer from above were used to prepare a magenta toner.

1.0 grams salt of zinc acetylacetonate was added to the magenta toner in the same manner as described in Example 1.

The particle size was obtained on a Coulter Counter using a 30 micron aperture. Population average was 1.6 microns. Volume average was 3.0 microns.

This toner was used to make a transferred image as described in Example 1. The transferred image was found to be non-tacky to back transfer on heating.

The transferred toner image had good quality with a resolution of 2-97% dots in a 150 lines per inch target.

The density was uniform at about 1.20 as measured on a Macbeth reflection densitometer.

EXAMPLE 3

A black toner was prepared according to the procedure of Example 1 with the following exceptions:

31.2 grams Sterling NS (Cabot Corp., Waltham, Mass. 02254), 240 grams triphenyl phosphate, and 128.8 grams of terpolymer from above were used to prepare a black toner.

1.0 gram of zinc acetylacetonate was added to 10 grams of black toner in the same manner as described in Example 1.

Mean particle size was 2.3 microns as measured on a Microtrac ® Particle Analyzer (Leeds and Northrup Instruments, North Wales, Pa. 19450).

This toner was used to make a transferred image as described in Example 1. The transferred image was found to be non-tacky on heating.

The transferred toner image had good quality with a resolution of 2-97% dots in a 150 lines per inch target. The density was uniform at about 1.30 as measured on a Macbeth reflection densitometer.

EXAMPLE 4

A yellow toner was prepared according to the procedure of Example 1 with the following exceptions:

28.0 grams Dalamar ® Yellow, YT-858-D (Heubach, Inc., Newark, N.J. 07114), 240 grams triphenyl phosphate, and 132 grams of terpolymer from above were used to prepare a yellow toner.

10 grams of yellow toner was then added to 1.0 gram of zinc acetylacetonate in the same manner as described in Example 1.

The mean particle size as measured on a Microtrac ® Particle Analyzer was 3.0 microns.

This toner was used to make a transferred image as described in Example 1. The transferred image was found to be non-tacky to back transfer on heating.

The transferred toner image had good quality with a resolution of 2-97% dots in a 150 lines per inch target. The density was uniform at about 1.10 as measured on a Macbeth reflection densitometer.

EXAMPLE 5

The toners and transfer process described above were used to make a four color proof. First, the cyan image was produced on Kromekote ® paper as described in Example 1 using the toner of Example 1. Second, the magenta image was generated as described in Example 2 using the toner of Example 2, except that the transfer was made on top of the cyan image in register using standard pin registration for the exposure and transfer steps. Third, the yellow image produced as described above using the yellow toner of Example 4 which was transferred, in register, on top of the magenta image. Finally, the black image was transferred, in register, on top of the yellow image using the toner of Example 4. After each transfer, the transferred image was heated by convection for five minutes on a hot plate at 200 degrees F. The image was sufficiently crosslinked after the heat treatment that there was no back transfer of the images from the paper to the next photopolymer surface. Thus, a high quality four color proof was generated.

EXAMPLE 6

Example 5 was repeated with the following exception: the transferred image was heated to a temperature of 380° F. by passing under a quartz heater at a distance of about 10 inches with a time of about two minutes for a proof size of 12×20 inches. Again, there was no back transfer of the image from the paper to the next photopolymer surface.

EXAMPLE 7

Toners were prepared as described in Examples 1, 2, 3, and 4 with the following exception: titanium acetylacetonate was used in place of zinc acetylacetonate. The titanium salt was made by drying from an isopropanol solution of Tyzor ® AA manufactured by E. I. du Pont de Nemours and Company, Wilmington, Del., and grinding the dried material into a powder in order to blend with the pigmented part of the toner. The transfers used both conductive and radiative heat to cure the transferred image and gave the same results as above.

EXAMPLE 8

A black toner was prepared as described in Example 7. The toner was used as described in Example 1 with the following exception: the toner image was transferred to an aluminum plate suitable for the preparation of a lithographic printing plate having a silicate coated surface. The photopolymer toned element was brought into intimate contact with the aluminum plate under high pressure in a nip formed by two rollers at 50° C. A uniform looking image was transferred into the aluminum plate. The transferred image was subsequently heated with conductive heat at 200° F. for 5 minutes to provide a more durable image. A gum arabic scrubbing and cleanser solution was wiped on the aluminum plate. The transferred image was then used as a lithographic printing plate to produce 25,000 inked impressions.

EXAMPLE 9

Example 5 was repeated except that the photopolymer film contained the following formulation:

| Ingredient | % dry weight |
| --- | --- |
| Polymethylmethacrylate (Elvacite ® 2051) | 19.3 |
| Polybutylmethacrylate (Elvacite ® 2045) | 9.2 |
| Polyvinylacetate (Vinac ® B15) | 18.5 |
| Trimethylolpropane trimethacrylate | 27.4 |
| Ethoxylated trimethylolpropane triacrylate | 7.6 |
| Polyethylene glycol(4)lauryl ether (Brij ® 30) | 7.6 |
| 2,2'-Bis(o-chlorophenyl)-4,4'-5,5'-tetraphenylbiimidazole | 2.4 |
| 2,2'-Bis(o-chlorophenyl)-4,4'-5,5'-tetrakis-(m-methoxyphenyl)-biimidazole | 2.4 |
| 2-Mercaptobenzoxazole | 2.4 |
| 2-(N-ethyl-1,2,3,4-tetrahydro-6-quinolylidene)-1-chromanone | 0.6 |
| 1-(2'-Nitro-4',5'-dimethoxy)phenyl-1-(4-t-butyl-phenyloxy)ethane | 2.8 |

The film was prepared as described in U.S. Pat. No. 4,461,823 at 90 mg/dm square coating weight on 7 mil subbed polyester film, and coated from methylene chloride solvent. A 0.5 mil polyester cover sheet was laminated to the photopolymer film.

The exposure for this film for each color separation was first to UV light using a Kokomo ® filter and imagewise to a 5 KW mercury vapor light source at about 40 inch distance to the frame for about 40 seconds, this generates an inhibitor imagewise as described previously in Dueber and Kempf. The second exposure is to blue light using the same light source but through a Lexan ® polycarbonate filter to filter out the UV light.

This polymerizes the monomers where inhibitor did not form in the first exposure.

The results were the same as in Example 5, except that the four color proof was generated from negative color separations instead of positive color separations as in Example 5.

What is claimed is:

1. A particulate non-electroscopic prolonged tack toner comprising:
   (i) an organic thermoplastic polymer containing acid groups;
   (ii) a solid plasticizer present in an amount from about 30% to about 90% by weight based on the total weight of the toner; and
   (iii) a crosslinking compound selected from the group consisting of:
   (a) a β-diketone compound of the general formula:

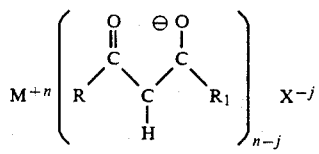

where
   M is a metal cation;
   R and $R_1$ which can be the same or different are alkyl of 1 to 18 carbon atoms, substituted alkyl of 1 to 18 carbon atoms, aryl of 6 to 30 carbon atoms;
   +n is the valency of the metal;
   J is 0 to n−1; and
   x⁻ is selected from the group consisting of OH, Cl, F, sulfate, nitrate, chlorate, phosphate, acetate, alkyl carboxylate of 1 to 18 carbon atoms, or aryl carboxylate of 6 to 30 carbon atoms; and
   (b) at least one organometallic compound selected from the group consisting of $M^{+n}(R-)_n$, $M^{+n}(CO_2R'-)_n$ and $M^{+n}(OR''-)_n$ where R, R', and R'', are independently selected from the group consisting of a linear or branched chain hydrocarbon of 1 to 30 carbon atoms, or a linear or branched chain, substituted hydrocarbon of 10 to 30 carbon atoms, M is a metal, and n is at least 2 and is equal to the valency of the metal.

2. A toner according to claim 1 wherein the organic thermoplastic polymer is a terpolymer consisting of substantially equal percentages by weight of styrene, alpha-methyl styrene and an acid selected from the group consisting of acrylic acid, and methacrylic acid, said terpolymer having an average molecular weight in the range of 1000 to 100,000 and being present in the range of 10 to 70% by weight.

3. A toner according to claim 1 wherein the organic thermoplastic polymer consists essentially of methyl methacrylate and acrylic acid.

4. A toner according to claim 1 wherein the linear or branched chain hydrocarbon of 10 to 30 carbon atoms is substituted with at least one substituent selected from the group consisting of a halogen, one or more hydroxyl groups, nitro cyclopentyl, cyclohexyl, and aryl.

5. A toner according to claim 1 wherein the β-diketone is zinc acetylacetonate.

6. A toner according to claim 1 wherein the β-diketone is titanium acetylacetonate.

7. A toner according to claim 1 wherein the β-diketone is aluminum acetylacetonate.

8. A toner according to claim 1 wherein the substituents attached to $M^{+n}$ in the formula for the β-diketone compound are selected from the group consisting of propionate, butyrate, hexoate, octoate, nonoate, 2-ethylhexoate, neodecanoate, naphthenate, ethoxide, butyl and isopropyl, and M is selected from the group consisting of Bi, Ca, Ce, Co, Fe, Mg, Mo, Mn, Ni, Pb, Ti, V, Zn, and Zr.

9. A toner according to claim 1 wherein the organometallic compound is selected from the group consisting of zinc naphthenate, zinc 2-ethylhexoate, zinc octoate, zirconium octoate, zirconium 2-ethylhexoate, manganese octoate, manganese naphthenate, manganese 2-ethylhexoate, barium 2-ethylhexoate, cobalt naphthenate, calcium octoate, calcium naphthenate, calcium 2-ethylhexoate, calcium nonoate, nickel octoate, bismuth octoate, bismuth neodecanoate, bismuth 2-ethylhexoate, lead octoate, cobalt octoate, lead naphthenate, cerium naphthenate, cerium 2-ethylhexoate, tetrabutyl titanate, tetra-2-ethylhexyl titanate, titanium tetraethoxide, tetraisopropyl titanate; calcium, cerium, cobalt, lead, manganese, zinc and zirconium neodecanoate, and mixtures thereof.

10. A toner according to claim 1 wherein the acid is acrylic acid.

11. A toner according to claim 1 wherein the plasticizer is triphenyl phosphate.

12. A toner according to claim 1 wherein a colorant is present in an amount ranging from 0.5% to 50%.

13. A toner according to claim 1 wherein the terpolymer is present in an amount of 20–50% of the total toner weight.

14. A toner according to claim 2 wherein the terpolymer has a molecular weight in the range of 1500 to 10,000.

15. A toner according to claim 2 wherein the terpolymer has a molecular weight in the range of 2000 to 8000.

16. A toner according to claims 1 or 11 wherein the plasticizer is present in an amount of 50% to 70% of total toner weight.

* * * * *